(12) United States Patent
Liu

(10) Patent No.: US 8,749,037 B1
(45) Date of Patent: Jun. 10, 2014

(54) MULTI-ACCESS MEMORY SYSTEM AND A METHOD TO MANUFACTURE THE SYSTEM

(75) Inventor: Hui Liu, Pleasanton, CA (US)

(73) Assignee: Altera Corporation, San Jose, CA (US)

( * ) Notice: Subject to any disclaimer, the term of this patent is extended or adjusted under 35 U.S.C. 154(b) by 9 days.

(21) Appl. No.: 13/284,827

(22) Filed: Oct. 28, 2011

(51) Int. Cl.
*H01L 23/02* (2006.01)

(52) U.S. Cl.
USPC .............. 257/685; 257/723; 257/E23.037; 438/109

(58) Field of Classification Search
USPC ........... 257/685, 723, E23.037, 686; 438/109
See application file for complete search history.

(56) References Cited

U.S. PATENT DOCUMENTS

2004/0195667 A1* 10/2004 Karnezos ............... 257/686
2006/0208358 A1*  9/2006 Henttonen ............. 257/738

* cited by examiner

*Primary Examiner* — Amar Movva
(74) *Attorney, Agent, or Firm* — Womble Carlyle Sandridge & Rice LLP

(57) ABSTRACT

A multiple memory access system is disclosed. The system includes a first die disposed on a package substrate. A second die is stacked above the first die. The first die, the second die and the package substrate form a first package. An IC is placed within a close proximity of the first package where the first die communicates with the second die at a first data rate while the first die communicates with the IC at a second data rate. The first data rate is higher than the second data rate.

21 Claims, 6 Drawing Sheets

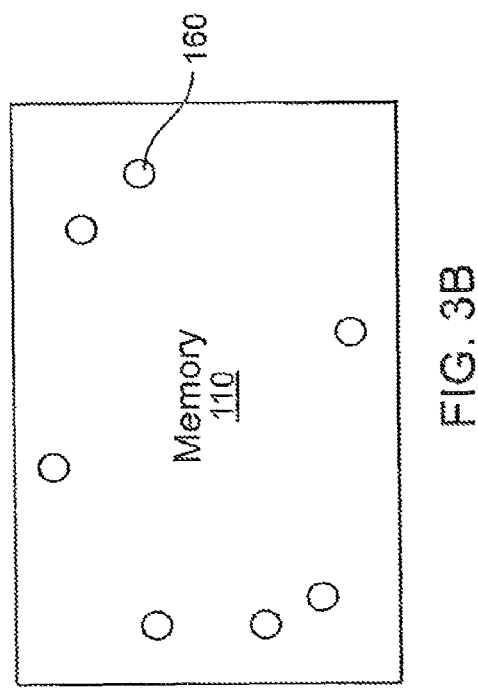

MULTI-ACCESS MEMORY SYSTEM AND A METHOD TO MANUFACTURE THE SYSTEM

BACKGROUND

An integrated circuit (IC) system typically has a memory component associated therewith. A memory component may be place on a printed circuit board (PCB) close to the IC, for instance. An IC utilizes a memory component to store temporary state or information to enable the IC to execute other tasks. An IC may be a microprocessor or a logic device. Memory component associated with an IC may communicate via electrical traces of a PCB.

But, one problem arises by way of communicating via PCB traces is negative timing margin. Negative timing margin is caused due to high cross talk and power noise generated by electrical traces on PCB when the IC system is in use. The distance between an IC and the memory component may further exacerbate these problems. Another problem is the limited number of PCB traces that support high performance memory due to area constraint on the PCB. The real estate shortage disallows the system to have enough PCB traces to support the high performance memory.

An inflexibility typically seen associated with the IC system that has a memory therewith is constant data rate speed between the IC and the memory. This eventually limits various applications that may need multiple data transfer capability.

It is within this context that the embodiments described herein arise.

SUMMARY

Embodiments described herein provide a multi-access memory system and a method to manufacture the system.

It should be appreciated that the present embodiment can be implemented in numerous ways, such as a process, an apparatus, a system, a device, or a method. Several inventive embodiments of the present invention are described below.

In one embodiment, a multiple memory access system is described. The system includes a first die disposed on a package substrate. A second die stacked above the first die, whereby the first die, the second die and the package substrate form a first package. An IC is disposed proximate to the first package. The first die communicates with the second die at a first data rate. Meanwhile, the first die communicates with the IC at a second data rate. The first data rate is greater than the second data rate.

In another embodiment, a method to package a substrate is described. The method includes forming a first package, which includes placing a first die on a package substrate. A second die is stacked above the first die, whereby the first and second dies are communicating at a first data rate. The first die is interconnected to the package substrate. The first package is interconnected to a second package, whereby the first package and the second package are communicating at a second data rate. The first data rate is higher than the second data rate.

Other aspects of the embodiment will become apparent from the following detailed description, taken in conjunction with the accompanying drawings, illustrating by way of example.

BRIEF DESCRIPTION OF THE DRAWINGS

The embodiment may be understood by reference to the following description taken in conjunction with the accompanying drawings.

FIG. 3B, meant to be illustrative and not limiting, illustrates a bottom surface view of the memory die in accordance with one embodiment.

DETAILED DESCRIPTION

The following embodiments describe a multi-access memory system and a method to manufacture the system. It will be obvious, however, to one skilled in the art, that the present embodiments may be practiced without some or all of these specific details. In other instances, well-known operations have not been described in detail in order not to unnecessarily obscure the present embodiments of the invention.

The current embodiment entails a multi-access memory system. The system provides a flexible system with multiple memories, where each memory is accessed at different communication data rate. The system also provides an optimal system level trade-off between high-end performance applications and low-end performance applications. Furthermore, the system may utilize unbounded input/outputs (IOs) to increase communication bandwidth with the memory. The system utilizes stacking technology that provides real estate savings for area constraint devices. The embodiments also describe a method to manufacture the system.

Figure 1:
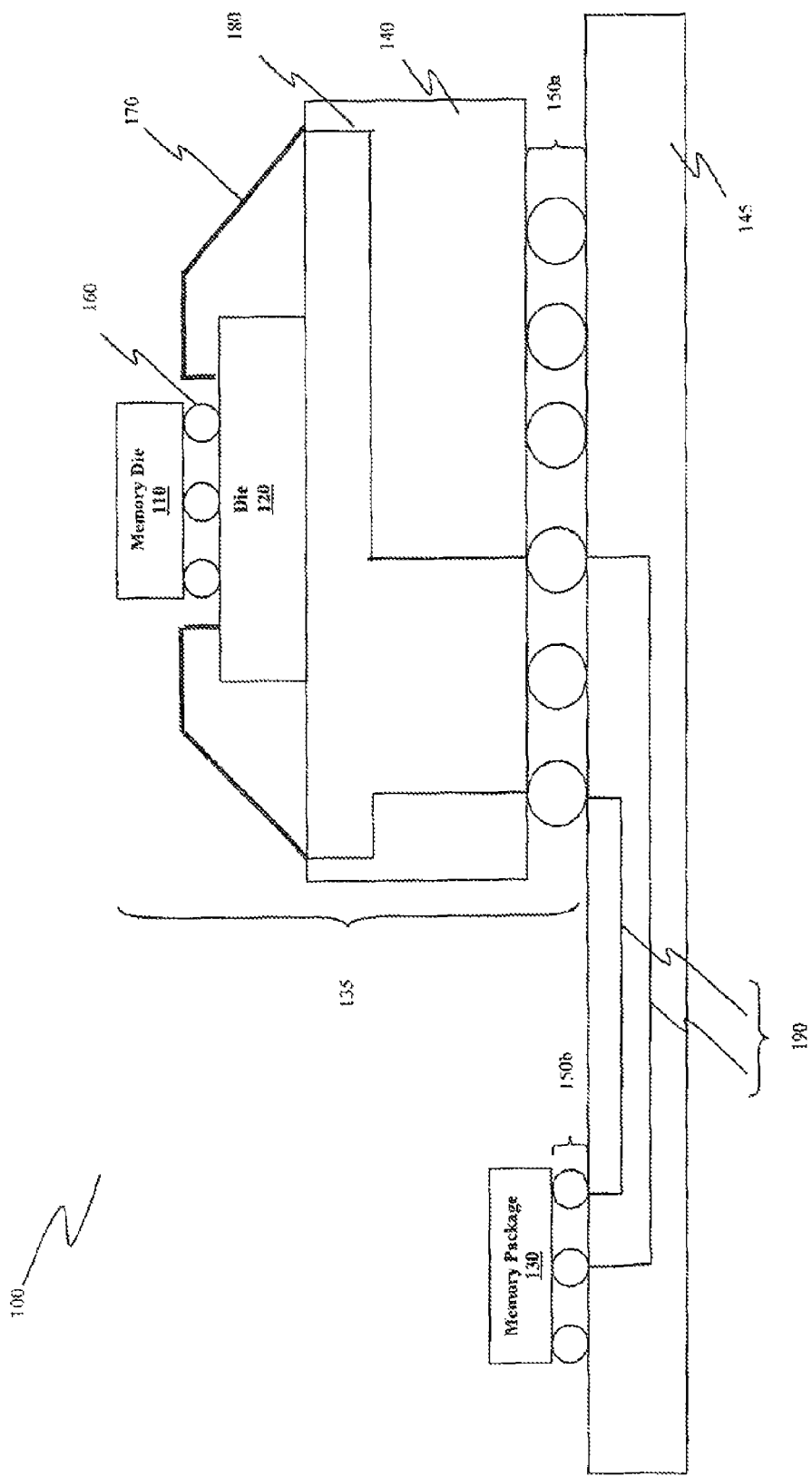
FIG. 1, meant to be illustrative and not limiting, illustrates an IC system using multiple memory accesses in accordance with one embodiment.

FIG. 1, meant to be illustrative and not limiting, illustrates an IC system with multiple memory access in accordance with one embodiment. The IC system 100 includes a memory package 130, a stacked package 135 and a PCB 145. The stacked package 135 includes a memory die 110, a die 120 and a package substrate 140. The IC system 100 also includes PCB traces 190, package traces 180, bumps 160, interconnections 170 herein illustrated as wire-bond interconnections and package interconnections 150a and 150b. According to one embodiment, the bumps 160 physically reside on the memory die 110. In one embodiment, the package interconnections 150a and 150b physically reside on the package substrate 140 and memory package 130, respectively. The package traces 180 are embedded within the package substrate 140. The PCB traces 190 are embedded within the PCB substrate 145. The memory package 130 may include a memory die within the package. Within the stacked package 135, the memory die 110 is located above the die 120. The memory die 110 and die 120 are located above the package substrate 140. In one embodiment, the memory die 110 is disposed on top of the die 120, hence forming a stacked die. The stacked package 135 is disposed over a substrate of the PCB 145. The memory package 130 is placed at a close proximity from the stacked package 135. The distance between the stacked package 135 and memory package 130 is determined by taking into account the subjected signal integrity issues. It is appreciated that the two packages are placed at a relatively close distance enabling communications without significant impact to the signal. It is also appreciated that the substrate within each package has multiple substrate layers.

In one embodiment, the memory die 110 is a DRAM. The DRAM can be a double data rate (DDR) DRAM. It is appreciated that the DDR DRAM can be of first, second or third generation, such as DDR, DDR2 or DDR3, respectively. In another embodiment, the memory die 110 is a non-volatile memory. In one embodiment, the die 120 is a programmable logic device (PLD), e.g., a Field Programmable Gate Array (FPGA). In another embodiment, the die 120 is a microprocessor. Memory package 130 may also include a DRAM in one exemplary embodiment. The die 120 may selectively utilize the memory die 110 and memory package 130 for storing, retrieving or holding data bits or information.

Signal length may impact the performance of the IC system 100. Signal length is a measure of distance that a signal travels from a source to a destination. In this exemplary embodiment, the signal length from the die 120 to the memory die 110 is shorter than the signal length from the die 120 to the memory package 130. Communications between the memory die 110 and the die 120 are through the bumps 160, whereas communication between the die 120 and the memory package 130 is through the interconnections 170, the package traces 140, the interconnections 150a and 150b, and the PCB traces 190. It should be appreciated that signal length, herein, determines the speed of data communication between two devices, e.g., the smaller the signal length, the faster the data communications between devices as in the data communications between the die 120 and memory die 110.

In one embodiment, the bumps 160 are micro-bumps. The micro-bumps are typically arranged in a pattern, e.g., in an array formation at the bottom surface of the memory die 110. The micro-bumps may be formed utilizing a photo lithography process on the memory die 110. The micro-bumps may be composed of a conductive reflow material, e.g., gold (Au) and tin (Sn). It is appreciated that composition selection for the micro-bumps are based on viscosity and specification of the IC manufacturing process, e.g., the amount of Sn composition is selected based on reflow process temperature, whereas the amount of Au composition is selected based on electrical conductivity. A flip-chip technology is utilized together with the bumps 160, to couple the memory die 110 to the die 120. Each of the bumps 160 transfers an IO signal or a power signal between the memory die 110 and the die 120. The bumps 160 are utilized as an interconnection by the die 120 to read or write bits within the memory die 110. The bumps 160 provide a relatively short signal length between the memory die 110 and die 120, which allows a high rate of data transfer. It is appreciated that the data rate may vary based on other factors, e.g., characteristics of the bumps 160 such as density and material, design of internal memory die circuitry, and etc.

Still referring to FIG. 1, the die 120 is coupled to the package substrate 140 through the interconnections 170. In one embodiment, the interconnections 170 are wire-bond interconnections. The wire-bond interconnection is composed of gold or other suitable conductive materials. The wire-bond interconnections couple a peripheral of the upper surface of the die 120 to a peripheral of the upper surface of the package substrate 140. In another embodiment, instead of wire-bond interconnections, micro-bump interconnections are utilized (not shown). It is appreciated that the micro-bump interconnections are arranged in a pattern. Each of the interconnections 170 provides a pathway to communicate an IO signal or a power signal between the package substrate 140 and the die 120. For example, one of the interconnections 170 may route power routing between the package substrate 140 and the memory die 110 through the die 120.

Still referring to FIG. 1, the stacked package 135 includes a plurality of package traces 180 embedded within the package substrate 140. The package traces 180 may be used to route IO signals and/or power signals from the die 120 to the PCB 145 via the interconnections 150a and 150b. The package traces 180 may be composed of copper (Cu) or another suitable material. In one embodiment, the package traces 180 include through hole vias and copper traces. It is appreciated that for each package, the number of through hole vias and copper traces may vary. In one embodiment, the package substrate 140 is composed of a dielectric material, e.g., a glass reinforced epoxy laminate sheet.

Still referring to FIG. 1, the stacked package 135 and the memory package 130 are coupled to the PCB 145 through the package interconnections 150a and 150b, respectively. In one embodiment, the package interconnections 150a and 150b are Ball Grid Array (BGA) interconnections. The BGA interconnections are solder ball interconnections on a package surface arranged in an array of grids. The interconnections 150a and 150b are coupled to pads that lie on the PCB 145. The pads are placed on an upper surface of the PCB 145. The pads are typically composed of copper for high conductivity between the interconnections 150a or 150b and the PCB traces 190.

Still referring to FIG. 1, the stacked package 135 is coupled to the memory package 130 through PCB traces 190. Each of the PCB traces 190 may either route an IO signal or a power signal to/from the package interconnections 150a or 150b. Hence, the PCB traces 190 are utilized by the stacked packaged 135 to read and/or write bits, to or from, the memory package 130. In one embodiment, each of the PCB traces 190 is composed of Cu material. It is appreciated that the length of the PCB traces 190 impacts integrity of signals being communicated between the stacked package 135 and the memory package 130. In one embodiment, increasing number of PCB traces 190 within the IC system 100 increases the bandwidth and improves data transfer between the stacked package 135 and memory package 130.

Still referring to FIG. 1, the IC system 100 allows an optimal system level trade off by utilizing different memories, i.e. memory package 130 and/or memory die 110, based on a desired data rate. The stacked package 135 communicates with the memory package 130 at a data rate that is lower than the data rate of communication between the die 120 and the memory die 110 within the stacked package 135. In one embodiment, the die 120 is a PLD. The IC system 100 having the PLD is programmed to support a high performance memory die 110 and a low performance memory package 130 depending on the application. The memory package 130 and memory die 110 sizes may vary based on the application the IC system 100. It is appreciated that the size of the memory die 110 or the memory package 130 may be varied selectively to achieve a corresponding data bandwidth. In one embodiment, the memory die 110 is physically, i.e., in terms of length and width dimension, as large as the die 120. It is appreciated that the memory size and the memory die IOs has a linear relationship. In another embodiment, the memory size of the memory die 110 is large enough to utilize the unbounded IOs of the die 120.

Figure 2:
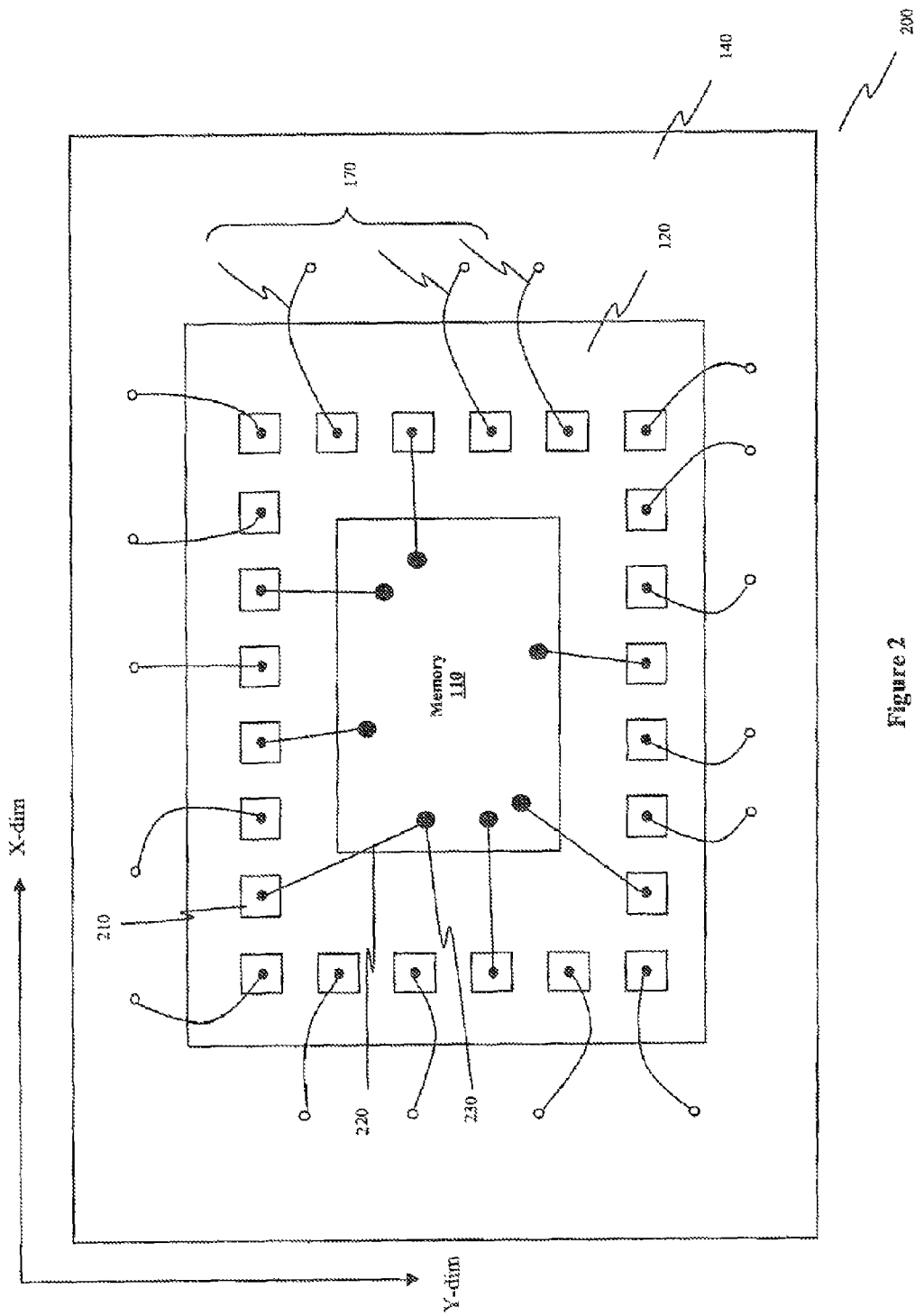
FIG. 2, meant to be illustrative and not limiting, illustrates a top view of the stacked package in accordance with one embodiment.

FIG. 2, meant to be illustrative and not limiting, illustrates a top view of the stacked package in accordance with one embodiment. The top view 200 of the stacked package 135 includes the memory die 110, the die 120, the interconnections 170, which herein are illustrated as wire-bond interconnections, and the package substrate 140. The top view 200 also includes pads 210, routings 220 and interconnections 230. In one embodiment, the pads 210 are wire-bond pads. For wire-bond interconnections, the pads 210 are placed at the periphery of the die 120 in one embodiment. The pads 210 are interconnected to the package substrate 140 through the wire-bond interconnections. The wire-bond interconnections are coupled to the pad 210 through stitch and bond connections as in one embodiment. The pads 210 are coupled to the interconnections 230 through the routings 220 disposed under a top surface of the die 120. In one embodiment, the routings 220 are surface routings that travel along the surface of the die 120. In another embodiment, the routings 220 are embedded routings that are embedded below the surface of the die 120. The routings 220 are connected to the memory die 110 through the interconnections 230. Each of the interconnections 230 includes a bump 160 as in FIG. 1 and an interconnection pad 310 as will be illustrated in FIG. 3A.

The pads 210 are either coupled to IOs or to power buffers of die 120 for transferring data or to power the die 120, respectively. Each of the pads 210 may also be coupled to an external source through one of the interconnections 170. It is appreciated that not all the IOs that are coupled to one of the pads 210, is to be coupled externally. This is because of limitations from potential electrical distortions. The IOs that are not coupled externally are referred to as unbounded IOs. In one embodiment, the die 120 is an FPGA die that has a plurality of unbounded IOs. In this embodiment, the memory die 110 utilizes the unbounded IOs for data communication between the die 120 and the memory die 110. It should be appreciated that the stacking of memory die 110 onto the die 120 do not require additional space on the package substrate 140 in this embodiment.

Still referring to FIG. 2, x-dimension (x-dim) and y-dimension (y-dim) of the memory die 110 are smaller than x and y dimensions of the die 120, and the x and y dimensions of the die 120 are smaller than x and y dimensions of the package substrate 140.

It is appreciated that the dimensions refer to the physical length and width of the components. In one embodiment, the die 120 has x and y dimensions identical to x and y dimensions of the package substrate 140. The die 120 may be coupled to the package substrate 140 through flip-chip interconnections when the die 120 and the package substrate 140 have substantially similar dimensions. It is, however, appreciated that the flip-chip interconnections is not limited to situations where the die 120 and the package substrate 140 have substantially similar dimensions. For example, flip-chip interconnections may be used to couple the die 120 and the package substrate 140 even if they have substantially dissimilar dimensions. It is further appreciated that flip-chip interconnections may be used for other components. For example, flip-chip interconnections may be used to couple the memory die 110 to the die 120 regardless of their respective dimensions.

It is appreciated that the pads 210 are separated to avoid signal interference in between adjacent pads 210. In contrast, the pads 210 may be placed underneath the memory die 110, e.g., in the middle of the die 120, if the die 120 and the memory die 110 are coupled using flip-chip interconnections.

Figure 3A:
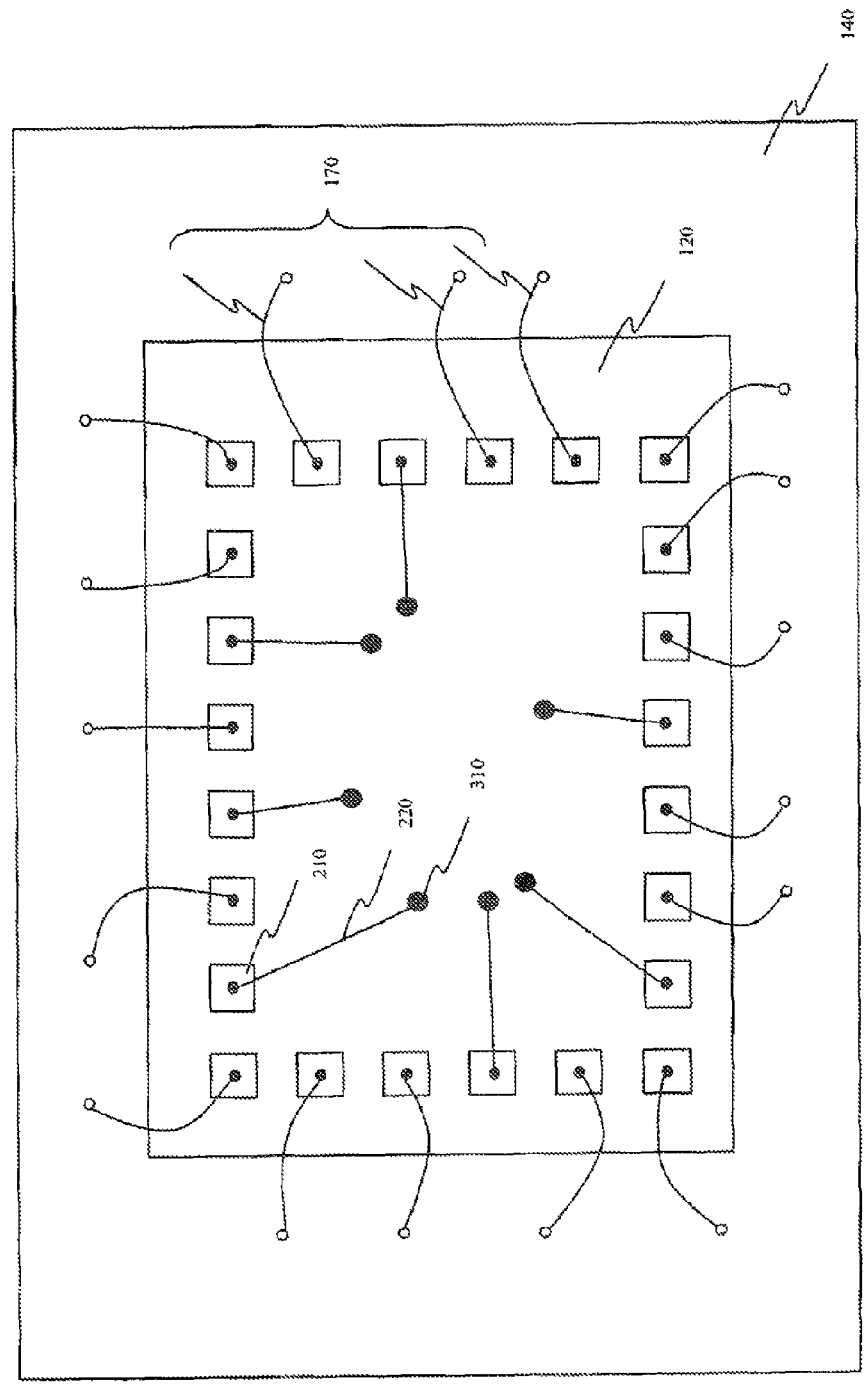
FIG. 3A, meant to be illustrative and not limiting, illustrates a top view the stacked package without the memory die in accordance with one embodiment.

FIG. 3A, meant to be illustrative and not limiting, illustrates a top view of the stacked package without the memory die. The embodiment includes all the components from FIG. 2 with the exception of the memory die 110. The upper surface of the die 120 has a plurality of interconnection pads 310, e.g., micro-bump pads. The interconnection pads 310 provide a connection means to the surface traces 220 and the bumps 160 on the memory die 110 of FIG. 3B. The interconnection pads 310 are aligned with the bumps 160 in accordance to one embodiment.

FIG. 3B, meant to be illustrative and not limiting, illustrates a bottom surface view of the memory die. The memory die 110 has a plurality of bumps 160. In one embodiment, the bumps 160 are micro-bump interconnections. The bumps 160 interconnect with the interconnection pads 310 as in FIG. 3A. The bumps 160 are arranged to reduce signal crosstalk between the bumps 160, in accordance to one embodiment. In another embodiment, some of the bumps 160 may be configured as terminals of output 10 buffers within the memory die 110.

Figure 4:
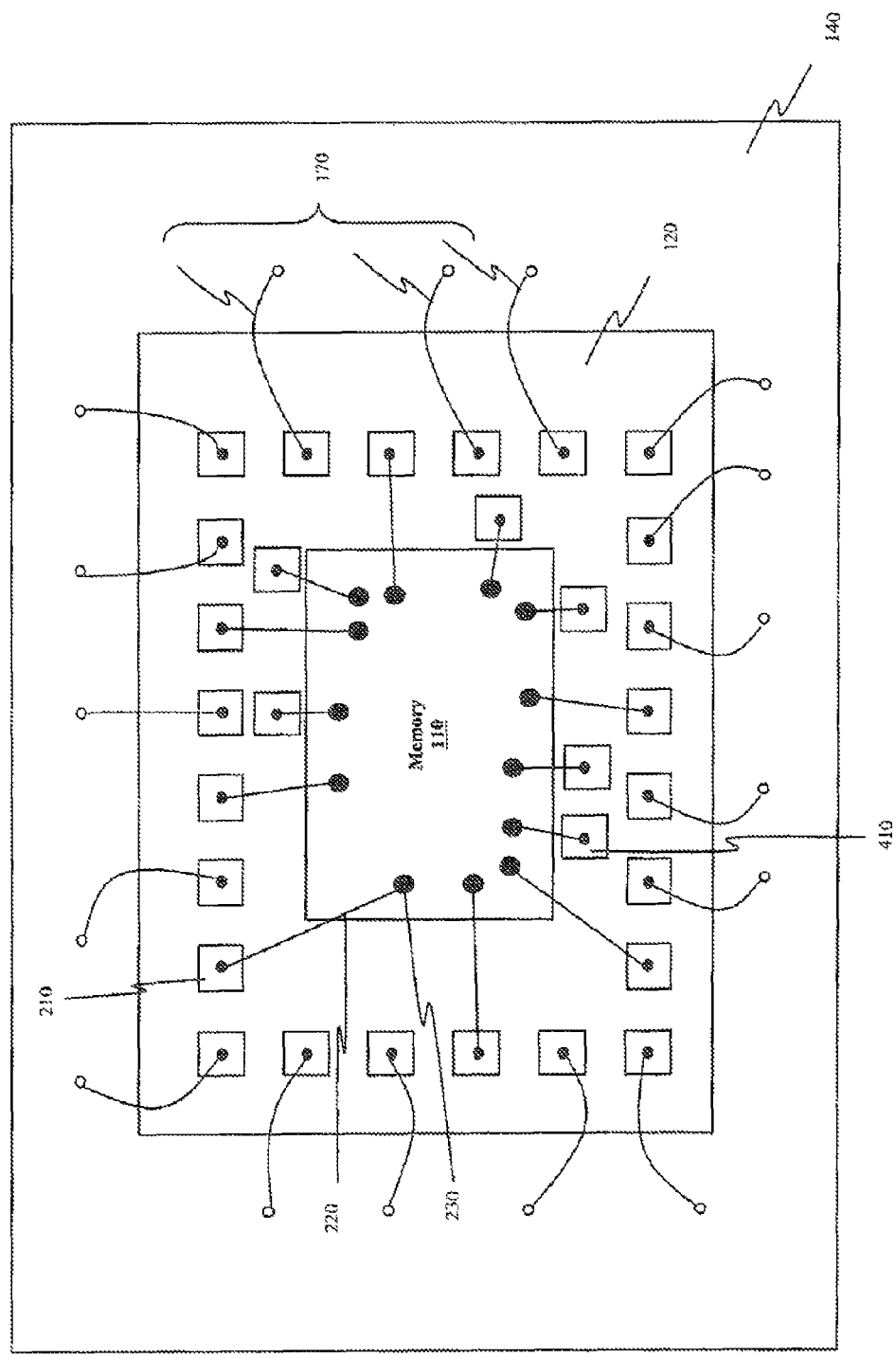
FIG. 4, meant to be illustrative and not limiting, illustrates a top view of the stacked package with enhanced bandwidth in accordance with one embodiment.

FIG. 4, meant to be illustrative and not limiting, illustrates a top view of the stacked package having an enhanced bandwidth. The additional pads 410 are coupled to the interconnections 230 through the routings 220. In one embodiment, the additional pads 410 are placed on an outer region of the region bounded by pads 210 of the die 120. In another embodiment, the additional pads 410 are coupled to the unbounded IOs of the die 120. The additional pads 410, herein, increase the communications bandwidth. Coupling of the die 120 to the memory die 110 through the additional pads 410 enables larger amount of data communication to take place at a given time. In one embodiment, the additional pads 410 may be used communicate input/output signals and/or address signals to the memory die 110. It is appreciated that if the additional pads 410 are for transferring IO signals, then a larger data size can be transferred in/out of the memory die 110. Whereas, if the additional pads 410 are for transferring address signals, then larger amount of data on the memory die 110 can be addressable at a particular time.

Figure 5:
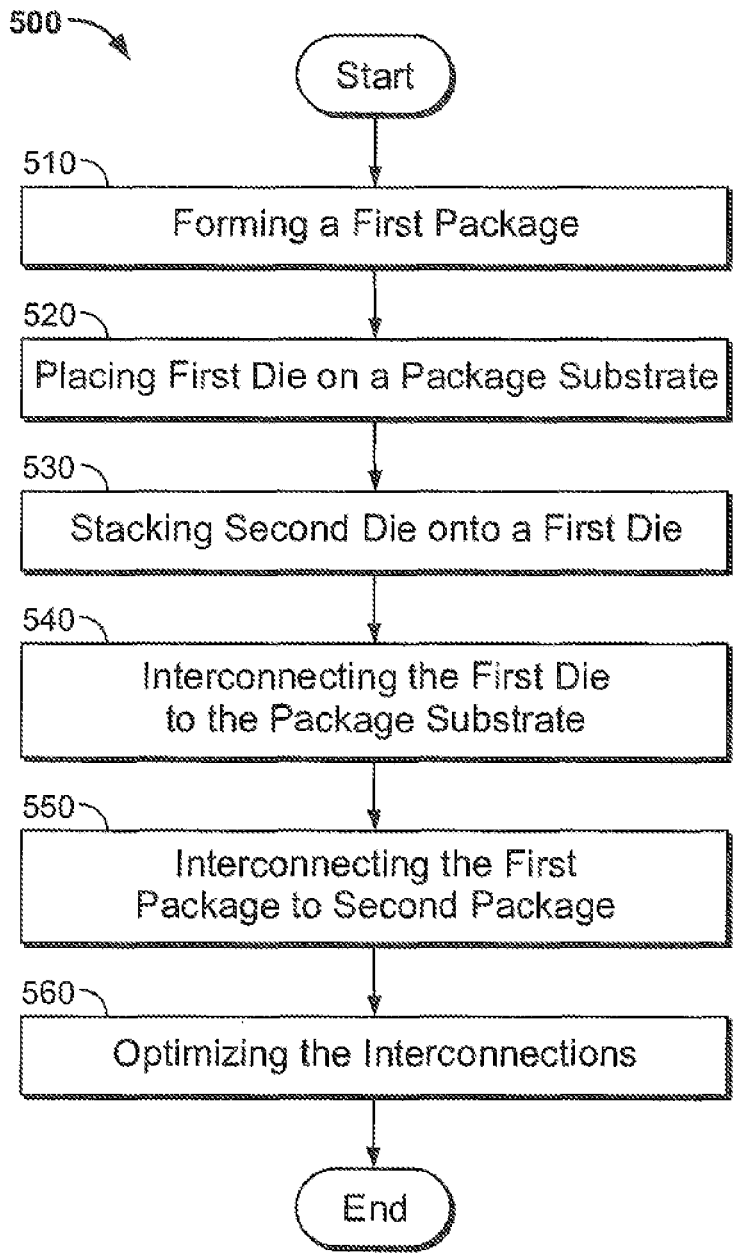
FIG. 5, meant to be illustrative and not limiting, illustrates a flowchart to manufacture an IC system in accordance with one embodiment.

FIG. 5, meant to be illustrative and not limiting, illustrates a flowchart to manufacture an IC system according to one embodiment of the present invention. The flowchart 500 refers to manufacturing the IC system 100 as illustrated in FIG. 1. At step 510, a package substrate for a first package is formed. In one example, the first package refers to the stacked package 135. At step 520, the first die is placed on top of the package substrate. In one exemplary embodiment, the first die refers to the die 120 and the package substrate refers to the package substrate 140. At step 530, a second die is stacked on the first die. In one exemplary embodiment, the second die refers to memory die 110. In one embodiment, the stacking utilizes micro-bump interconnections together with flip-chip technology. According to one embodiment, the second die is stacked on the first die for faster data communication between the two. The number of the interconnections between the first and second die may be increased if the IC system requires faster data communication, to and from, the memory and vice versa.

At step 540, the first die is interconnected to the package substrate, e.g., using interconnections 170. In one embodiment, the interconnections are wire-bond interconnections. In another embodiment, the interconnections are flip-chip interconnections, e.g. bump interconnections. At step 550, the first package is interconnected to a second package. Both the first and second packages are on a PCB. The second package may refer to the memory package 130. The interconnections between the first package and second package are through the electrical traces 190 of the PCB 145.

Communication speed and data transfer between the first and the second package changes as the distance between the first and second package changes. In one embodiment, the PCB traces 190 are sufficiently spaced apart to reduce cross talk. It is appreciated that negative timing margins may result from shorter trace length on the PCB. At step 560, the interconnections between the first and second die or the first and second package may be optimized to satisfy data rate requirement. In one embodiment, more interconnections may be provided from the first to the second die if the IC system requires faster data communication, while fewer interconnections may be required for a slower data communication. In one embodiment, increasing the number of interconnections between the first and second die increases the bandwidth.

The embodiments, thus far, were described with respect to integrated circuits. The method and apparatus described herein may be incorporated into any suitable circuit. For example, the method and apparatus may be incorporated into numerous types of devices such as microprocessor or programmable logic devices. Exemplary of programmable logic devices include programmable arrays logic (PALs), programmable logic arrays (PLAs), field programmable logic arrays (FPLAs), electrically programmable logic devices (EPLDs), electrically erasable programmable logic devices (EEPLDs), logic cell arrays (LCAs), field programmable gate arrays (FPGAs), just name a few.

The programmable logic device described herein may be part of a data processing system that includes one or more of the following components; a processor; memory; IO circuits; and peripheral devices. The data processing can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the family of devices owned by the assignee.

Although the method of operations were described in a specific order, it should be understood that other operation may be performed in between described operations, described operations may be adjusted so that they occur at slightly different times or described operations may be distributed in a system which allows occurrence of the processing operation at various intervals associated with the processing, as long as the processing of the overlay operations are performed in a desired way.

Although the foregoing invention has been described in some detail for the purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A multiple memory access system comprising:
    a first die disposed on a package substrate;
    a second die stacked on the first die with a plurality of bumps or balls each coupling the second die to the first die by physically contacting the second die and the first die, wherein the first die, the second die and the package substrate form a first package; and
    an Integrated Circuit (IC) placed proximate to the first package,
    wherein the first die is operable to communicate with the second die at a first data rate and the first die is operable to communicate with the IC at a second data rate, the first data rate is greater than the second data rate.

2. The system in claim 1, wherein the second die and the IC are memory chips and the first package and the IC are disposed on a surface of a printed circuit board.

3. The system in claim 2, wherein a memory size of the second die is equivalent to a memory size of the IC.

4. The system in claim 2, wherein the memory size of the second die is larger than a memory size of the IC.

5. The system in claim 2, wherein the first die is one of a programmable logic device or a microprocessor.

6. The system in claim 1 further comprising:
    a first interconnection coupling an upper surface of the first die to a lower surface of the second die, wherein the first interconnection is a plurality of micro-bump interconnections; and
    a second interconnection coupling the upper surface of the first die to the package substrate, wherein the second interconnection is a combination of a wire-bond and a micro-bump interconnection.

7. The system in claim 6, wherein the first interconnection and the second interconnection are located on the periphery of the upper surface of the first die.

8. The system in claim 1 further comprising:
    a plurality of pads that interconnect the first die to the second die, wherein the plurality of pads is coupled to an unbounded Input Output (IO) within the first die.

9. The system in claim 1, wherein the first die further comprises:
    a wire-bond pad that provides an interface to an unbounded I/O of the first die;
    a micro bump pad that couples to a micro-bump interconnection of the second die; and
    an electrical surface routing disposed along a surface of the first die, the electrical surface routing coupling the wire-bond pad to the micro-bump pad.

10. A multiple memory access system comprising:
    a first package comprising:
        a first die having a surface with a plurality of micro bump pads and surface routings; and
        a second die that is stacked above the surface of the first die, the second die is coupled to the first die through the micro bump pads and each of the plurality of micro bump pads having a bump or ball that physically contacts the first die and the second die; and
    a second package placed proximate to the first package, the first package and the second package disposed on a surface of substrate,
    wherein the first die communicates with the second die at a first data rate and the first die communicates with the second package at a second data rate, the first data rate is greater than the second data rate.

11. The system in claim 10, wherein the second die and the second package comprise memory chips.

12. The system in claim 10, wherein the first package further comprises:
    a package substrate coupled to the first die through one of wire bonds or micro-bump interconnections.

13. The system in claim 10, wherein the first die is one of a programmable logic device or a microprocessor.

14. The system in claim 10 further comprising:
    a plurality of micro-bumps located at a bottom surface of the second die, wherein said plurality of micro-bumps is operable to be coupled to unbounded Input Outputs (IOs) of the first die.

15. A method for forming a multi-access system, said method comprising:
- forming a first package that includes a first die, a second die and a package substrate, wherein the method of forming comprises,
- placing the first die on the package substrate;
- stacking the second die on the first die, wherein the first die is operable to communicate with the second die at a first data rate via a plurality of bumps or balls each physically contacting the second die and the first die; and
- interconnecting the first die to the package substrate; and
- coupling the first package with a second package, wherein the first die is operable to communicate with the second package at a second data rate, the first data rate is greater than the second data rate.

16. The method in claim 15, wherein the first package is coupled to the second package through Printed Circuit Board (PCB) traces.

17. The method in claim 15, wherein the first die and second package comprise memory chips.

18. The method in claim 17, wherein a memory size of the second die is larger than a memory size of the second package.

19. The method in claim 15 further comprising:
- coupling the first die and the second die through micro bumps.

20. The method in claim 15 further comprising:
- coupling the second die and the package substrate through wire bonds.

21. The system in claim 11, wherein a memory size of the second die is greater than or equal to a memory size of the second package.

* * * * *